United States Patent
Ghose et al.

(10) Patent No.: US 11,675,951 B2
(45) Date of Patent: Jun. 13, 2023

(54) METHODS AND SYSTEMS FOR CONGESTION PREDICTION IN LOGIC SYNTHESIS USING GRAPH NEURAL NETWORKS

(71) Applicants: Amur Ghose, Montreal (CA); Yingxue Zhang, Montreal (CA); Zhanguang Zhang, Montreal (CA)

(72) Inventors: Amur Ghose, Montreal (CA); Yingxue Zhang, Montreal (CA); Zhanguang Zhang, Montreal (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 188 days.

(21) Appl. No.: 17/334,657

(22) Filed: May 28, 2021

(65) Prior Publication Data

US 2022/0405455 A1     Dec. 22, 2022

(51) Int. Cl.
*G06F 30/392*     (2020.01)
*G06F 30/398*     (2020.01)
(Continued)

(52) U.S. Cl.
CPC .......... *G06F 30/392* (2020.01); *G06F 18/213* (2023.01); *G06F 18/2163* (2023.01);
(Continued)

(58) Field of Classification Search
CPC .. G06F 30/392; G06F 18/213; G06F 18/2163; G06F 18/29; G06F 30/398; G06N 3/08; G06N 3/02
(Continued)

(56) References Cited

U.S. PATENT DOCUMENTS

2008/0059931 A1   3/2008   Peters et al.
2013/0086544 A1   4/2013   Alpert et al.
(Continued)

FOREIGN PATENT DOCUMENTS

CN     111539178 A     8/2020

OTHER PUBLICATIONS

Lin, Y., Jiang, Z., Gu, J., Li, W., Dhar, S., Ren, H., Khailany, B. and Pan, D.Z., 2020. Dreamplace: Deep learning toolkit-enabled gpu acceleration for modern vlsi placement. IEEE Transactions on Computer-Aided Design of Integrated Circuits and Systems.
(Continued)

*Primary Examiner* — Paul Dinh

(57) ABSTRACT

Method and system for assisting electronic chip design, comprising: receiving netlist data for a proposed electronic chip design, the netlist data including a list of circuit elements and a list of interconnections between the circuit elements; converting the netlist data to a graph that represents at least some of the circuit elements as nodes and represents the interconnections between the circuit elements as edges; extracting network embeddings for the nodes based on a graph topology represented by the edges; extracting degree features for the nodes based on the graph topology; and computing, using a graph neural network, a congestion prediction for the circuit elements that are represented as nodes based on the extracted network embeddings and the extracted degree features.

20 Claims, 11 Drawing Sheets

(51) Int. Cl.
  *G06N 3/08* (2023.01)
  *G06F 18/20* (2023.01)
  *G06F 18/213* (2023.01)
  *G06F 18/21* (2023.01)

(52) U.S. Cl.
  CPC ............ *G06F 18/29* (2023.01); *G06F 30/398* (2020.01); *G06N 3/08* (2013.01)

(58) Field of Classification Search
  USPC ........................................................ 716/100
  See application file for complete search history.

(56) References Cited

U.S. PATENT DOCUMENTS

| | | |
|---|---|---|
| 2018/0165400 A1 | 6/2018 | Feld et al. |
| 2020/0151288 A1 | 5/2020 | Ma et al. |
| 2021/0334445 A1* | 10/2021 | Goldie .................. G06F 30/392 |

OTHER PUBLICATIONS

Kirby, R., Godil, S., Roy, R. and Catanzaro, B., Oct. 2019. Congestion-Net: Routing congestion prediction using deep graph neural networks. In 2019 IFIP/IEEE 27th International Conference on Very Large Scale Integration (VLSI-SoC) (pp. 217-222). IEEE.

Qiu, J., Dong, Y., Ma, H., Li, J., Wang, K. and Tang, J., Feb. 2018. Network embedding as matrix factorization: Unifying deepwalk, line, pte, and node2vec. In Proceedings of the eleventh ACM international conference on web search and data mining (pp. 459-467).

Chanpuriya, S. and Musco, C., Aug. 2020. Infinitewalk: Deep network embeddings as Laplacian embeddings with a nonlinearity. In Proceedings of the 26th ACM SIGKDD International Conference on Knowledge Discovery & Data Mining (pp. 1325-1333).

Li, Z., Zhang, L. and Song, G., Jul. 2019. Sepne: Bringing separability to network embedding. In Proceedings of the AAAI Conference on Artificial Intelligence (vol. 33, No. 01, pp. 4261-4268).

Chen, X., Heimann, M., Vahedian, F. and Koutra, D., Oct. 2020. CONE-Align: Consistent Network Alignment with Proximity-Preserving Node Embedding. In Proceedings of the 29th ACM International Conference on Information & Knowledge Management (pp. 1985-1988).

Heimann, M., Shen, H., Safavi, T. and Koutra, D., Oct. 2018. Regal: Representation learning-based graph alignment. In Proceedings of the 27th ACM international conference on information and knowledge management (pp. 117-126).

* cited by examiner

150

Input: Graph $G = (V, E)$, temperature $T$, thresholding range $L, H$, max size of a graph $S$, embedding dimension $K$, degree feature dimension $K'$

Output: Degree features $D_G$ and embedding $E_G$ if $|V| \geq S$ then
  Create an iterator of partitions $I$ using METIS or other tool over $G$ ⟩ 106
else
  $I = \{G\}$
end
for $P \in I$ do
  Let $A_P, D_P$ be the adjacency and degree matrices of $P$ ;
  Laplacian $L_P = I - D_P^{-1/2} A_P D_P^{-1/2}$ ;
  $M_P^T = 11^T + Tr(D) D_P^{-1/2} L_P D_P^{-1/2}$ ;
  $M_P^\beta = 11^T + \frac{M_P^T}{T}$ ;
  Clamp $M_P^\beta$ to range $[L, H], L > 0$ ;
  $M_P^\beta \leftarrow \log(M_P^\beta)$ (entrywise log) ;
  $U_P, S_P, U_P^T \leftarrow$ Top-K eigendecomposition of $M_P^\beta$ ;
  Change sign of every eigenvector in $U_P$ that has leading entry $\leq 0$ ;
  $E_P \leftarrow U_P S_P$ or $U_P (S_P)^{\frac{1}{2}}$
end ⟩ 140
Concatenate $E_P, P \in I$ to create $E_G$ ;
for $v \in V$ do
  for $i \leftarrow 1$ to $K'$ do
    $S_{v,i} = \{u \in V : d(u, v) \leq i\}$ ;
    $D_G[v, i-1] = |S_{v,i}|$
  end
end ⟩ 142
Return concatenated $D_G, E_G$ ⟩ 108 (spanning 140 and 142)

FIG. 5

Input: Graph $G = (V, E)$, node attributes $N_G$, degree/embedding features $E_G$, $D_G$, METIS or other cluster position $P_G$, iterator $I$,

Output: Prediction $\tilde{Y}_G$ for $P \in I$ do
    Load saved $D_P$, $E_P$ from cache (subsets of $D_G$, $E_G$);
    Concatenate with node attribute features $N_P$;
    Input to the GNN the concatenation;
    Obtain the prediction $\tilde{Y}_P$;
end
Collect $\tilde{Y}_G$ as $\cup \tilde{Y}_P$ ;

Input: Graph $G = (V, E)$, node attributes $N_G$, labels $Y_G$, epochs $T$
Output: GNN model that can predict $Y_G \approx Y_G$
Create an iterator of partitions $I$ using METIS or other tool over $G$ ;
for $P \in I$ do
    Define $N_P, Y_P$ as the subset of $N_G, Y_G$ corresponding to $P$ ;
    Compute degree features $D_P$, embedding $E_P$, cache them ;
end
for $i \leftarrow 0$ to $T$ do
    for $P \in I$ do
        Load $D_P, E_P$ from caches;
        Concatenate with node attribute features $N_P$ ;
        Input to the GNN the concatenation ;
        Obtain the prediction $\hat{Y}_P$;
        Backpropagate using square loss $\|\hat{Y}_P - Y_P\|^2$, $Y_P$ being label ;
        Take one optimization step using ADAM ;
    end
end

FIG. 9

METHODS AND SYSTEMS FOR CONGESTION PREDICTION IN LOGIC SYNTHESIS USING GRAPH NEURAL NETWORKS

RELATED APPLICATIONS

This is the first application relating to the present disclosure.

FIELD

The present disclosure relates to systems and method for electronic design automation, and specifically to graph neural network based methods and systems for congestion prediction in logic synthesis.

BACKGROUND

Electronic design automation (EDA) can be broadly understood as the task of specifying, designing and then fabricating a chip. During the design phase, the design is first represented as Register Transfer Level (RTL) in a hardware description language (VDHL or Verilog). This RTL design is then converted to a physical layout for manufacturing through a process that includes a logic synthesis stage and a physical design stage. During the logic synthesis stage, the human readable hardware language script is converted to gate-level netlist data. The netlist data contains a component list of circuit elements (macros, cells, input/output (I/O) pins) and a list (netlist) of interconnections between the circuit elements (known as nets). Macros are IP (Intellectual Property) -protected circuit elements (RAM, ROM, etc.); Cells (also referred to as standard cells) are logic gate circuit elements that performs basic logic functions (AND, OR, NAND, etc.); I/O pins are physical pins that allow the chip to interface with a substrate. Each net is a list of macro, cell, and I/O pin IDs that are connected together. Some optimization techniques are used in the logic synthesis process to reduce component number and to meet timing constraints. Usually, a macro is larger than a standard cell in physical size.

In the physical design stage, the netlist of a chip design is converted into a geometric representation (also known as a layout). The physical design phase includes a placement phase. During the placement phase stage, all the circuit elements in the netlist are placed on a simulated circuit board, with all the constraints considered. Then the elements in the same net are connected by physical wires in the routing process. The wires can only be located in the horizontal/vertical tracks defined in the metal layer specifications. To compute the congestion level, the routing region is first partitioned into rectangular grids, each of which may accommodate tens of routing tracks in each direction. In order for the design to be valid, the demand (required routing tracks) in each grid cannot exceed its capacity (number of tracks available), otherwise overflow will occur. Congestion maps can be used to represent the congestion that results from a particular placement solution. To fulfill the congestion requirement, the designer may need to redo the placement to allow more routing space in the congested area. In the case of poor netlist design, there might not be any valid placement solutions available and the netlist needs to be optimized. Macros, in addition to being larger than standard cells, are often placed beforehand and can often be considered as a type of fixed cell during chip design, or at least with less freedom of movement. Thus, placement stage during chip design is typically most concerned with optimizing the placement of standard cells.

Knowing a potential routing congestion at the early design stage is of great importance and can be used to guide the optimization iterations at lower cost. However, current EDA tools require that cell placement be at least partially completed prior to enabling an accurate determination of cell congestion. Current approaches to the congestion prediction problem solve it when the placement problem is already partially complete. This results in an iterative, time consuming design approach where intermediate placements must be repeatedly improved based on the partial congestion feedback.

Accordingly, an EDA solution that can enable routing congestion to be accurately and efficiently predicted before a cell placement phase of the physical design stage is desirable.

SUMMARY

According to a first aspect of the disclosure is a method and system for assisting electronic chip design, comprising: receiving netlist data for a proposed electronic chip design, the netlist data including a list of circuit elements and a list of interconnections between the circuit elements; converting the netlist data to a graph that represents at least some of the circuit elements as nodes and represents the interconnections between the circuit elements as edges; extracting network embeddings for the nodes based on a graph topology represented by the edges; extracting degree features for the nodes based on the graph topology; and computing, using a graph neural network, a congestion prediction for the circuit elements that are represented as nodes based on the extracted network embeddings and the extracted degree features.

The extraction of network embeddings for the nodes based on a graph topology represented by the edges and the extracting of degree features for the nodes based on the graph topology may in at least some examples enable sufficient congestion data to be predicted prior to a placement operation that congestion issues can be efficiently addressed prior to placement of circuit element during a chip design process.

According to an example of the first aspect, the method comprises partitioning the graph into a plurality of partitioned graphs that each comprise a respective subset of the nodes and edges, and wherein computing the respective congestion predictions is performed independently for each of the plurality of partitioned graphs.

According to one or more of the preceding aspects, the method comprises partitioning the graph into a plurality of partitioned graphs that each comprise a respective subset of the nodes and edges, wherein extracting the network embeddings for the nodes comprises performing a matrix factorization for each of the plurality of partitioned graphs.

According to one or more of the preceding aspects, performing a matrix factorization for each of the plurality of partitioned graphs comprises non-linear spectral network embedding using a Laplacian matrix.

According to one or more of the preceding aspects, extracting network embeddings for the nodes comprises applying a random-walk based embedding.

According to one or more of the preceding aspects, the congestion prediction for each circuit element is indicative of a demand for wire routing tracks at a location corresponding a placement location for the circuit element of the proposed electronic chip design.

According to one or more of the preceding aspects, the circuit elements included in the netlist includes macros, standard cells and chip terminals, wherein macros are larger than standard cells, and converting the netlist data to the graph comprises representing only the standard cells as nodes.

According to one or more of the preceding aspects, converting the netlist data to the graph comprises generating a node feature vector that includes a set of attributes for each node, wherein the set of attributes includes dimensions of the standard cell represented by the node.

According to one or more of the preceding aspects, the method comprises concatenating the set of attributes, the degree features and the networks embeddings for each node to generate an enhanced node feature vector, wherein the graph neural network is configured to generate the respective congestion predictions based on the enhanced node feature vectors.

According to one or more of the preceding aspects, the method comprises generating a set of training data by performing circuit element placement based on a plurality of instances of netlist data, and determining, for each instance of netlist data respective ground truth congestion labels for circuit elements included in the netlist data; and performing supervised training of the graph neural network using the set of training data.

According to a further example aspect a computer system is disclosed comprising one or more processing units and one or more non-transient memories storing computer implementable instructions for execution by the one or more processing devices, wherein execution of the computer implementable instructions configures the computer system to perform the method of any one of the preceding aspects.

According to a further example aspect, a non-transient computer readable medium is disclosed that stores computer implementable instructions that configures a computer system to perform the method of any one of the preceding aspects.

BRIEF DESCRIPTION OF THE DRAWINGS

Reference will now be made, by way of example, to the accompanying drawings, which show example embodiments of the present application, and in which:

FIG. 5 is a pseudocode representation of operations performed by the topology feature extraction module.

FIG. 7 is a pseudocode representation of operations performed by the neural network module.

FIG. 9 is pseudocode representation of operations performed to train the neural network module.

Similar reference numerals may have been used in different figures to denote similar components.

DESCRIPTION OF EXAMPLE EMBODIMENTS

Figure 1:
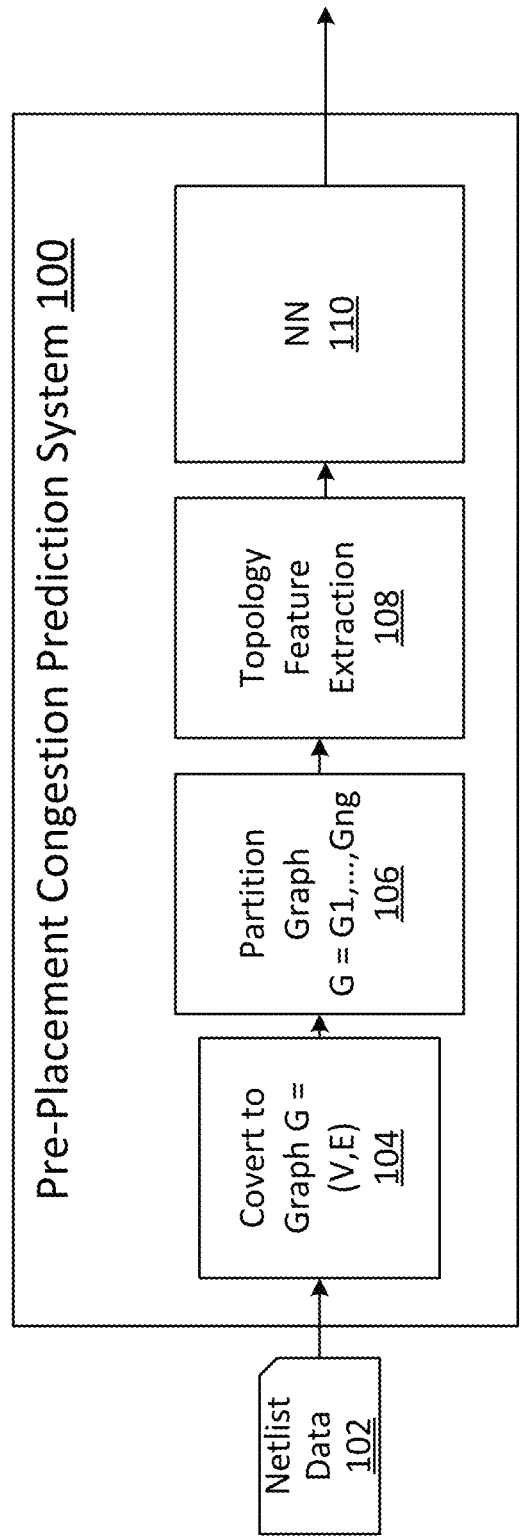
FIG. 1 is a block diagram of a system for congestion prediction in logic synthesis using graph neural networks.

Examples are disclosed of systems and methods that apply an efficient learning based algorithm that enables a graph neural network-based prediction model to perform congestion prediction prior to a cell placement phase. A circuit design is modelled as a graph, with circuit elements represented as graph nodes, and interconnections between circuit elements represented as edges.

The disclosed system and methods can be especially suitable for the case when knowledge of the logic function of the chip being designed and the features (e.g., attributes per cell) of the design is limited. Example embodiments can apply matrix factorization based embedding methods to predict cell attributes that can then be applied in a GNN based solution.

As known in the art, a graph is a data structure that can be used to represent a group of real world objects and the relationships between such objects. Objects are represented in graph as respective vertices (v) in a set of vertices (V) (vertices are also referred to as nodes) and the relationships between objects are represented by a set of edges E, i.e. graph G=(V, E). The set of edges might consist of directed edges (i.e., the relationship from one node to an adjacent node is a uni-directional relationship), or undirected edges (i.e., the relationship between two adjacent noes is reciprocal). The set of nodes V might be homogeneous (all of one type, e.g. all cells in the present example) or heterogeneous (e.g., item nodes and user nodes)

The representation of the graph is done using an adjacency matrix A, which is a square matrix where the value of A at spot (i,j) is 1 if there is an edge i–>j, otherwise the value is zero. For undirected graphs, the adjacency matrix A is always symmetric. G and A correspond to each other uniquely (bijectively) and to specify G is to specify A, for homogeneous graphs. The examples considered in this description will be homogeneous.

As known in the art, an artificial neural network is a model which results from the repeated application of functions of the form S(Wx+b), where S is any activation function (Sigmoid, Tan H, ReLU etc.), W is a matrix of learnable parameters, x is the input and b is a bias term. Graph neural networks (GNNs) apply functions of the form S(Wx+b) using a special type of convolution that respects an adjacency matrix A of an input graph to compute a node representation for each element in set of elements. A node representation is an association of a k-dimensional vector to each node, where k is much smaller than the number of nodes. If two nodes are similar in the graph—i.e., if the distance in the graph between two nodes is low, their respective vectors should also be similar.

A graph representation is computed from some initial representation given by an input dataset, for example a set of node attribute features. Usually the final output for regression can be a scaler value, and the key representation task is till the penultimate layer. That is to say, the output layer is meant to match whatever label is provided, but the key task of representation is to find intermediate layers that carry meaning about the input while being predictive of the label.

FIG. 1 is a block diagram illustrating a computer-implemented pre-placement congestion prediction system 100 for use during a logic synthesis stage of a chip design, according to example embodiments. System 100 includes a plurality of modules 104 to 112 that will be described in greater detail below. As used here, a "module" can refer to a combination of a hardware processing circuit and machine-readable instructions (software and/or firmware) that are executable on the hardware processing circuit. The combined hardware processing circuit and machine-readable instructions implement a module that preforms a set of one or more defined functions or operations. A hardware processing circuit can include any or some combination of a microprocessor, a core of a multi-core microprocessor, a microcontroller, a programmable integrated circuit, a programmable gate array, a digital signal processor, or another hardware processing circuit.

Figure 2:
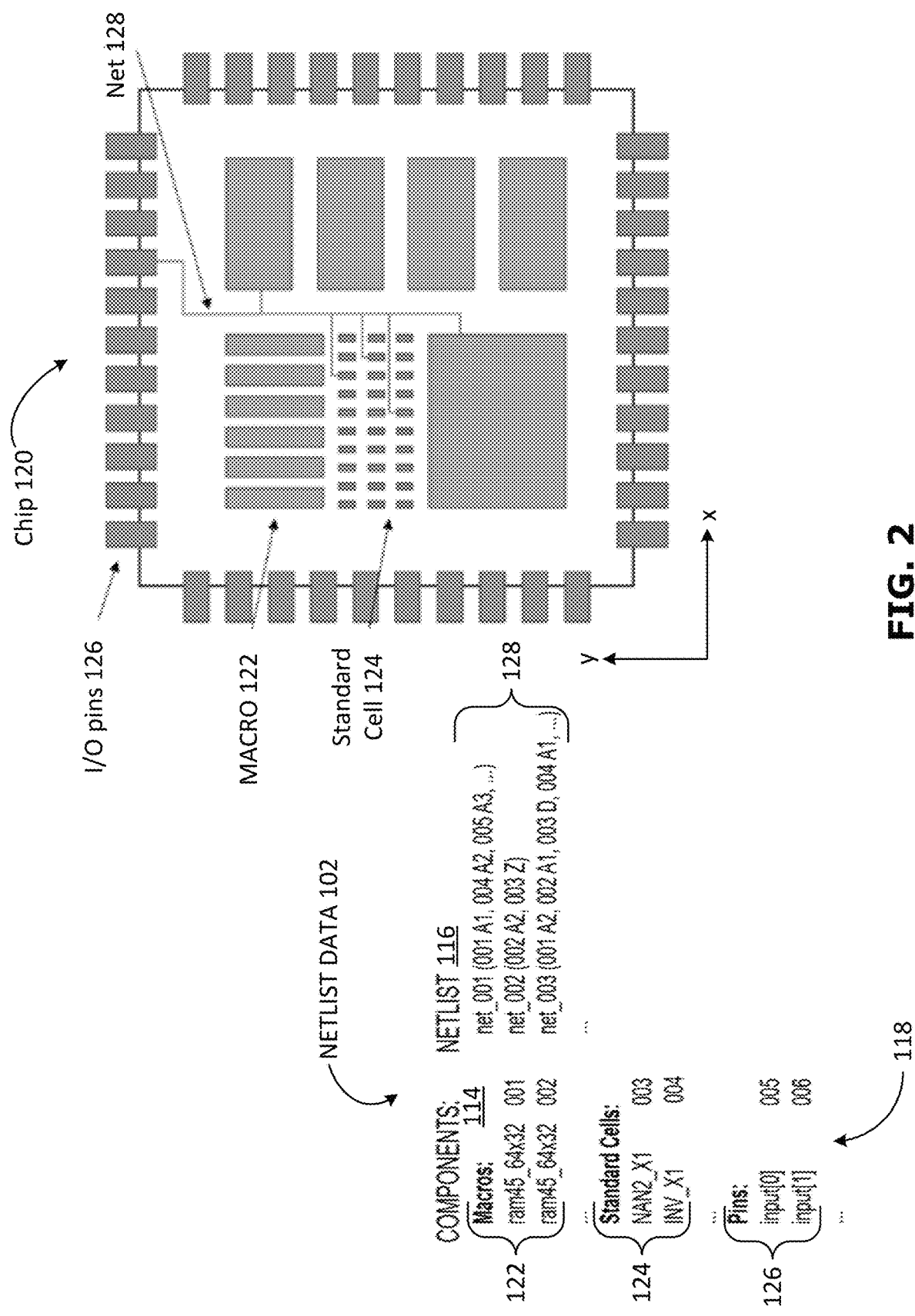
FIG. 2 shows an example of netlist data and a chip layout.

Netlist data 102 for a target chip design is provided as input data to the congestion prediction system 100. An illustrative of netlist data 102 is shown in FIG. 2 together with an illustrative layout, on an orthogonal x, y placement coordinate system, of a design for a target chip 120. The netlist data 102 includes a component list 114 of circuit elements 118 that identifies three categories of circuit elements 118, macros 122, standard cells 124, and chip terminals 126 (also referred to as I/O pins 126). As noted above, macros 122 include IP protected circuit elements such as memory circuit elements (RAM, ROM, etc.); standard cells 124 include logic gate circuit elements that performs basic logic functions (AND, OR, NAND, etc.); and chip terminals 126 are physical I/O pins of the chip. The netlist data 102 also includes a netlist 116 that identifies interconnections between the circuit elements 118. Each discrete set of interconnections is known as a net 128. Thus, each net 128 is a list of ID's of the macro 122, standard cell 124, and I/O pins IDs 126 that are connected together by a common conductive trace (also referred to as a "wire"). Macros 122 and standard cells 124 will typically have multiple respective terminals (also referred to as circuit element pins), respectively, and these terminals will also be identified in a net 128. As noted above, macros 122 will typically be physically larger than standard cells 124 and include more terminals. By way of illustrative example, in some cases a macro may be five to 100 times larger, in a single axis, than a standard cell.

As can be appreciated from the illustration of chip 120 in FIG. 2, grid congestion is most likely to occur in groups of standard cells 124, as multiple connecting conductive traces are required in a relatively small space as compared to macros 124. Additionally, I/O pins 126 are typically symmetrically placed around the periphery of a chip 120 and thus have a defined placement. Accordingly, in an illustrated example, the placement of macros 122 and I/O pins 126 are assumed to be generally pre-defined, and congestion prediction system 100 is configured to focus on congestion among standard cells 124.

Figure 3:
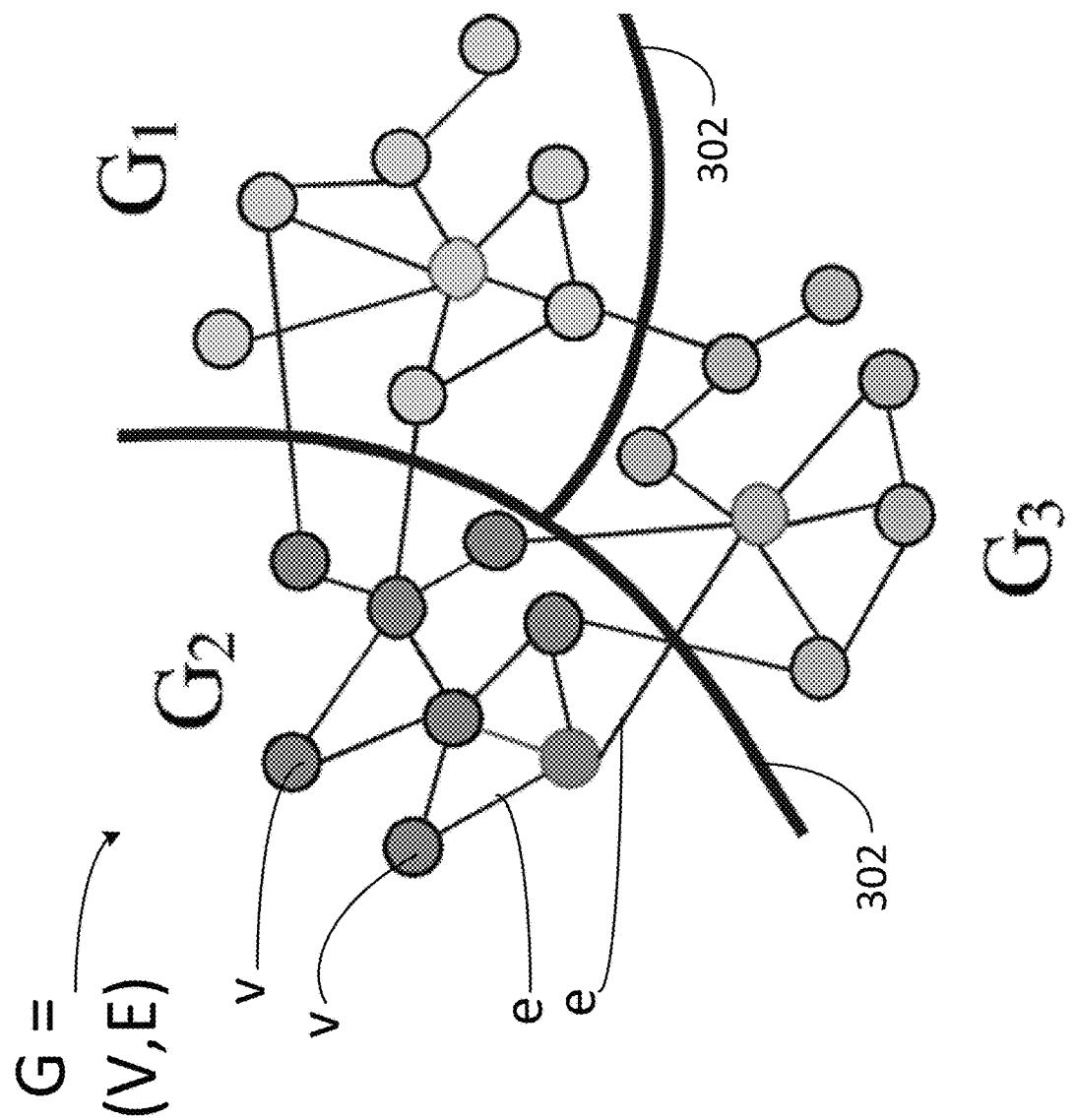
FIG. 3 illustrates a graph partitioning operation.

Referring again to FIG. 1, congestion prediction system 100 includes a graph conversion module 104 that is configured to transform netlist data 102 into a graph data structure, an example of which is shown in FIG. 3. The graph data structure, graph G=(V,E), represents each circuit element 118 as a respective node v in the set of nodes V, and each edge e in the set of edges E represents an interconnection between a pair of circuit elements 118, as defined in the netlist 116. In the presently described embodiment, congestion is considered in the context of standard cells 124 and accordingly data about macros 122, I/O pins 118 and their corresponding interconnection information is removed from netlist data 102, such that only standard cells 124 are represented as respective nodes v in the node set V of graph G, and only interconnections between standard cells 124 identified in netlist 116 are identified in edge set E. In some examples, each standard cell 124 (for example each cell "k") is represented with a unique node feature vector $\hat{v}$ that includes a set of node attributes $\{x1, \ldots, xN\}$ (where N is number of node attributes or dimensions). In one example, N=3 and includes a placement footprint size for the standard cell 124 (e.g., an x dimension and a y dimension) and a number of cell terminals (e.g., number of circuit element pins that the cell has). The edges can be represented as a two dimensional adjacency matrix "A", with all standard cells 124 being represented on both axes and the matrix elements at the intersections of two standard cells 124 indicting the presence or absence of a connecting trace. In examples, nets 128 are converted to normal edges by pairwise insertion of edges between every pair of nodes v.

In typical cell designs, it will be desirable to place groups of standard cells 124 that share common connections together (within congestion constraints) and separate groups that don't share many common connections. Accordingly, as shown in FIG. 1, in example embodiments the congestion prediction system 100 includes a partitioning module 106 that is configured to partition the graph G into a set of partitioned graphs $\{G'1, \ldots, G'ng\}$ (where ng is the number of partition graphs; G'p is used below to reference an illustrative partition graph). Each partitioned graph G'p represents a respective sub-set of standard cells 124 that have common connections with each other but relatively few connections with the other partitioned graph sub-sets of standard cells 124. Accordingly, partitioning module 106 is configured to divide graph G into a plurality of partitioned graphs $G'=\{G'1, \ldots, G'ng\}$ such that the combination of these partitioned graphs $\{G'1, \ldots, G'ng\}$ together constitute graph G by union, and that each node v(i) belongs to only one partitioned graph G'j and the set of edges E'j of the partitioned graph G'j is a subset of the edges E of the graph G. FIG. 3 illustrates graph G divided into three respective partition graphs G'1, G'2, G'3 by partition lines 302. Any edges e that are included in E but not in the union of $\{E'1, \ldots, E'ng\}$ can be referred to as cut edges (i.e., edges that would otherwise connect the standard cells that are represented as nodes in different partitioned graphs). The cut edges in FIG. 3 are those with a partition line 302 passing through them.

By way of non-limiting example, a possible partitioning algorithm that can be applied by partitioning module 106 is METIS partitioning. As known in the art, METIS partitioning uses a multilevel approach that has three phases and comes with several algorithms for each phase: (1) Coarsen the graph by generating a sequence of graphs G0, G1, ..., Gn, where G0 is the original graph and for each $0 \leq i \leq j \leq n$, the number of vertices in Gi is greater than the number of vertices in Gj; (2) Compute a partition of Gn; and (3) Project the partition back through the sequence in the order of Gn, ..., G0, refining it with respect to each graph. The final partition computed during the third phase (the refined partition projected onto G0) is a partition of the original graph.

Congestion prediction system 100 includes a topology feature extraction module 108 that is configured, in a first example embodiment, to generate network embeddings and extract features for each of the partitioned graphs $\{G'1, \ldots, G'ng\}$ included in graph set G'. As noted above, in example embodiments, only three attributes are included in each node feature vector $\hat{v}$. In some examples, even fewer attributes may be known. Furthermore, the agency matrix Ap that represents the graph topology of edge set Ep will typically be sparse. Accordingly, topology feature extraction module 108 is used to generate additional embeddings and features for each node v by extracting information from the partitioned graph that the node is part of. These additional embeddings and features can then be concatenated with the known attributes of the node feature vector v̂ to provide enhanced data for processing by a GNN.

Figure 4:
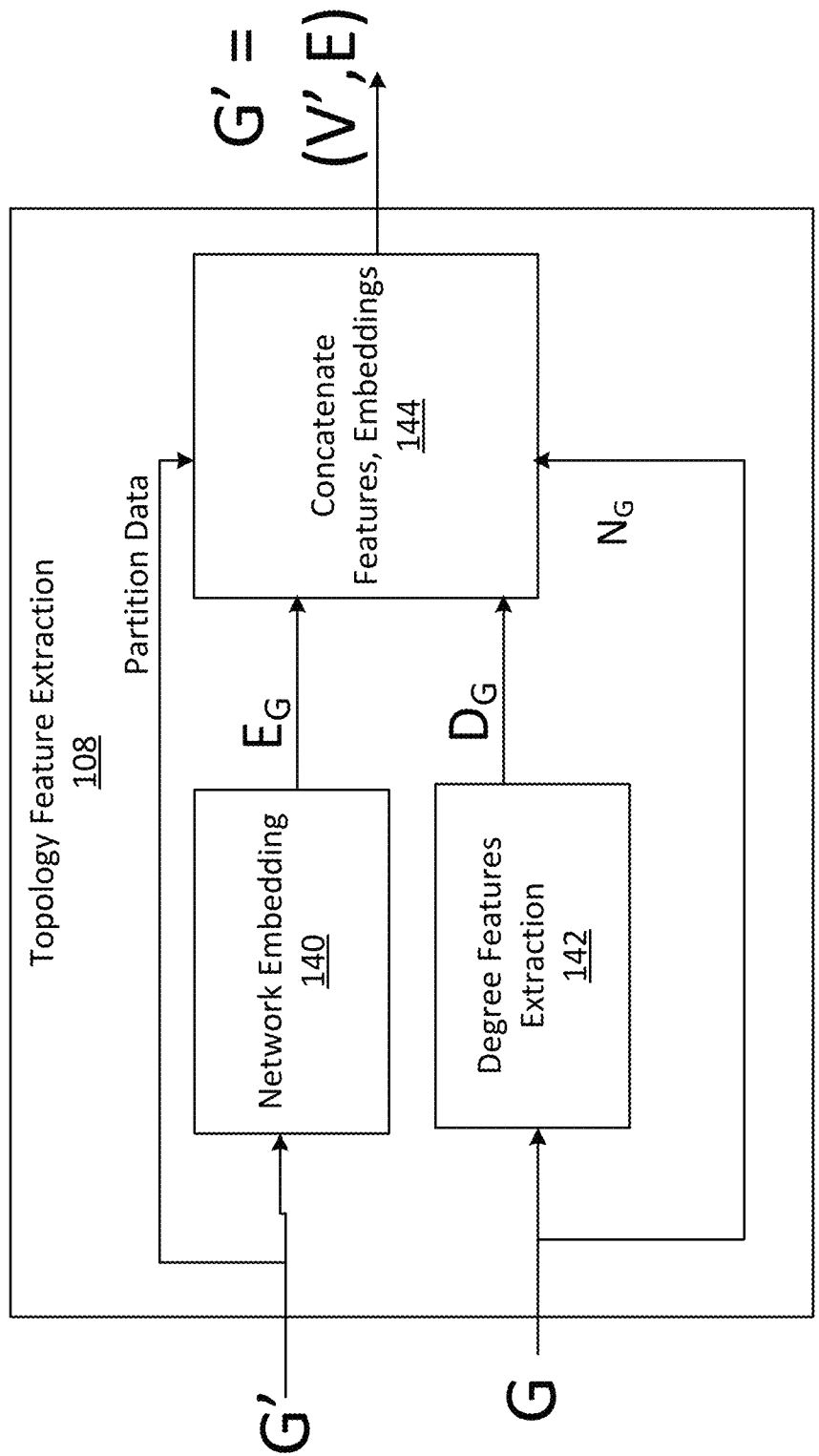
FIG. 4 is a block diagram of a topology feature extraction module of the system for congestion prediction.

With reference to FIG. 4, topology feature extraction module 108 can include a network embedding operation 140 and a degree features extraction operation 142. The network embedding operation 140 is configured to apply matrix factorization to generate a set of node network embeddings Ep for each partitioned graph Gp, where Ep includes a respective K dimensional node network embedding ê for each node v included in partitioned graph G'p. The node network embeddings Ep for all partitioned graphs {G'1, . . . , G'ng} collectively form a set of node network embeddings $E_G$ for graph G.

The node network embeddings Ep for each partitioned graph G'p can be generated using different methods in different embodiments. In a first example, the node network embeddings Ep are generated using non-linear spectral network embedding, and more particularly spectral-node embedding using matrix factorization. Given a graph partition P with associated adjacency, degree and Laplacian matrices $A_p$, $D_p$, $L_p$, the following Table 1 provides a list of steps that can be applied by network embedding module 140 to apply matrix factorization to generate network embedding matrix $E_p$:

TABLE 1

Non-Linear Spectral Network Embedding $11^T$ is an all-ones matrix; T is a defined temperature parameter; and Laplacian matrix $Lp = G'p - D_p^{-1/2} A_p D_p^{-1/2}$

- $M_P' = 11^T + Tr(D_P) D_P^{-1/2} L_P D_P^{-1/2}$
- $M_P'' = 11^T + \frac{M_P'}{T}$
- Clamp $M_P''$ to range [L, H], L > 0
- $M_P'' \leftarrow \log(M_P'')$ (entrywise log)
- $U_P, S_P, U_P^T \leftarrow$ Top-K eigendecomposition of $M_P''$
- Flip eigenvectors in $U_P$ to have leading entry ≥ 0
- $E_P \leftarrow U_P S_P$ or $U_P (S_P)^2$ In the steps Table 1, it will be noted that $D_P^{-1/2} A_p D_p^{-1/2}$ encodes a transition matrix for a random walk on the graph G'p. The temperature parameter T affects the number of neighbors that influence the embedding of a single node v. In some examples, T is set to a low value (e.g., 1) to address potential over-smoothing problems that can arise in GNN processing. In example embodiments, the process steps of Table 1 generates a K-dimensional network embedding ê for each node v included in partitioned graph G'p. These embeddings are comparable between partitions due to the use of the adjacency matrix Ap, mitigating against a requirement for further alignment that may be required by other node embedding methodologies.

The use of non-linear spectral network embedding may in some applications provide advantages as no explicit embedding alignment is required. Such embedding can be more computationally efficient than random walk based embedding methods which require explicit alignment via post-processing methods. Not only does non-linear spectral network embedding eliminate the need for alignment via post-processing, the network embedding is learned via matrix factorization, which is RAM-intensive but time efficient when compared to random-walk based embeddings. Further, the use of graph partitioning to divide graph G into smaller size graphs can alleviate the RAM-intensive requirements non-linear spectral network embedding. The combination of the graph partitioning and the non-linear spectral network embedding can have positive impacts on training efficiency, and memory efficiency in addition to eliminating the requirement embedding alignment across graphs.

In alternative embodiments, network embedding module 140 can apply different embedding methods than non-linear spectral network embedding to generate node network embeddings Eg for the un-partitioned graph G. For example, random-walk based network embedding can alternatively be used, followed (during training) by explicit embedding alignment. Any suitable random-walk based embedding method can be used, including, by way of example, well known random-walk based embedding methods such as: LINE: Large-scale Information Network Embedding; node2vec; and DeepWalk. During system training, after computing the node network embeddings for each training graph G, the embeddings for the different graphs G are aligned to make the embeddings comparable. The alignment is done with respect to a test graph and by CONE-ALIGN in a minibatch setting. After alignment, the random-walk network embeddings can be used in the same way as the non-liner spectral network embeddings. Note that in the case of random-walk based network embedding, the network embedding module 140 does not use partitioned graph set G' {G1, . . . , Gng}.

Degree features extraction operation 142 is configured to generate a set of degree features $D_G$ that includes a respective K' dimensional degree feature vector d̂ for each of the nodes v included in graph G. In example embodiments, the K' dimensional degree feature vector d̂={$d_1$, . . . , $d_{k'}$} for each node v is constructed as follows. The first element $d_1$ in feature vector d̂ is the degree of the node v. The j-th element $d_j$ is the number of nodes, reachable within distance j (j-hop away), from node v.

As shown in FIG. 4, for each node v, the original N node attributes from node feature vector v̂ can be concatenated at a concatenation operation 144 with the K dimensional node network embedding ê generated for the node v and the K' dimensional degree feature vector d̂ to provide an structural embedding enhanced N+K+K' node feature vector v̂'. In some example embodiments, the original nodes v may not have any associated attributes (for example in preliminary stages of a complex chip design, only the number of standard cells may be identified, with no dimensional or terminal count details), in which case the resulting structural embedding enhanced node feature vector v̂' will consist of K+K' dimensions. In example embodiments, partition data that defines the structure of partitioned graph set G'= {G'1, . . . , G'ng}, and the concatenated node feature vectors v̂' are arranged into their respective partition graphs {G'1, . . . , G'ng}.

FIG. 5 illustrates a pseudo-code representation of the operations performed by graph partition module 106 and topology feature extraction module 108 for an embodiment in which network embedding operation 140 applies non-linear spectral network embedding.

Figure 6:
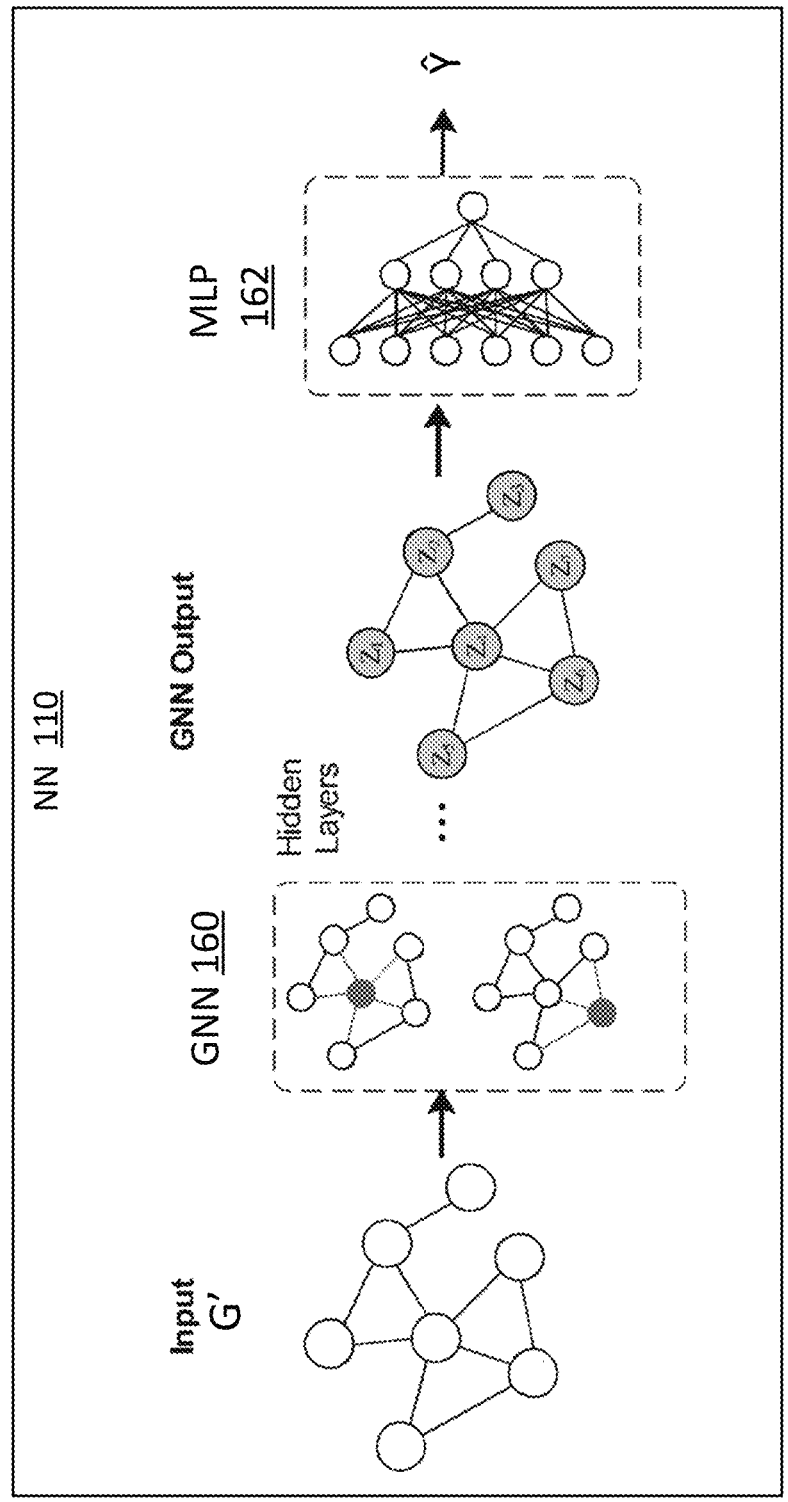
FIG. 6 is a schematic representation of a neural network module of the system for congestion prediction.

Referring again to FIG. 1, congestion prediction system 100 includes a neural network (NN) module 110 for processing concatenated feature vector set V'. Referring to FIG. 6, NN module 110 includes a GNN 160 that has been trained to approximate a function that maps the concatenated feature vector v̂' for each node v of each partitioned graph {G'1, . . . , G'ng} to a respective GNN node congestion prediction vector ẑ.

GNN 160 may use a number of different configurations. In deeper GNN models, over smoothing can becomes an issue as the predictions for all nodes can tend to become similar. In at least some examples, the partitioning of graph G can enable a relatively shallow GNN model 160 to be used, which can help alleviate over smoothing. By way of illustrative example, GNN model 160 could be implemented using a SAmple and aGregateE (SAGE) architecture with 2 hidden layers of size 200, 160.

The GNN node congestion vector $\hat{z}$ for each node v of each partitioned graph output from the final layer of the GNN 160 is provided to a post-predictor multilayer perceptron (MLP) 162 that is configured to map the GNN node congestion vector $\hat{z}$ for each node v to a respective congestion prediction $\hat{y}$. In one non-limiting example, MLP 162 may comprise two hidden layers of size 150, 150. In some examples, MLP 162 may be omitted.

FIG. 7 is a pseudocode representation of the operation of NN module 110, where MLP 162 is omitted and GNN 160 directly outputs the set of congestion predictions $\hat{Y}$. At indicated in FIG. 7, each partition graph is processed independently by GNN 160.

As will be explained in greater detail below, the surface area layout for proposed chip 120 can be represented as a uniform grid that that divides the chip placement surface into a matrix of grid-cells. In example embodiments, the NN module 110 can be trained such that the congestion prediction $\hat{y}$ for a node v is indicative of the ratio of the demand for routing tracks, implicit in netlist data 102, within a grid-cell that the standard cell (e.g., cell that is represented by the node v corresponding to congestion prediction $\hat{y}$) is located within, relative to a defined threshold capacity of routing tracks for that grid-cell.

The set $\hat{Y}$ of congestion predictions can then be provided as output to a chip designer to provide feedback of possible issues with the netlist data 102. For example, a respective congestion prediction $\hat{y}$ can be provided in a list for each of the standard cells 124 included in the netlist data 102. If required, changes can be made to the chip design during the logic synthesis stage and revised netlist data 102 evaluated to determine if the resulting set $\hat{Y}$ of congestion predictions is acceptable. Once the chip designer is content with the set $\hat{Y}$ of congestion predictions for a particular chip design, then the physical design stage can proceed.

Accordingly, congestion prediction system 100 enables congestion issues to be recognized and addressed prior to placement of the circuit elements 118 during the chip design process.

Figure 8:
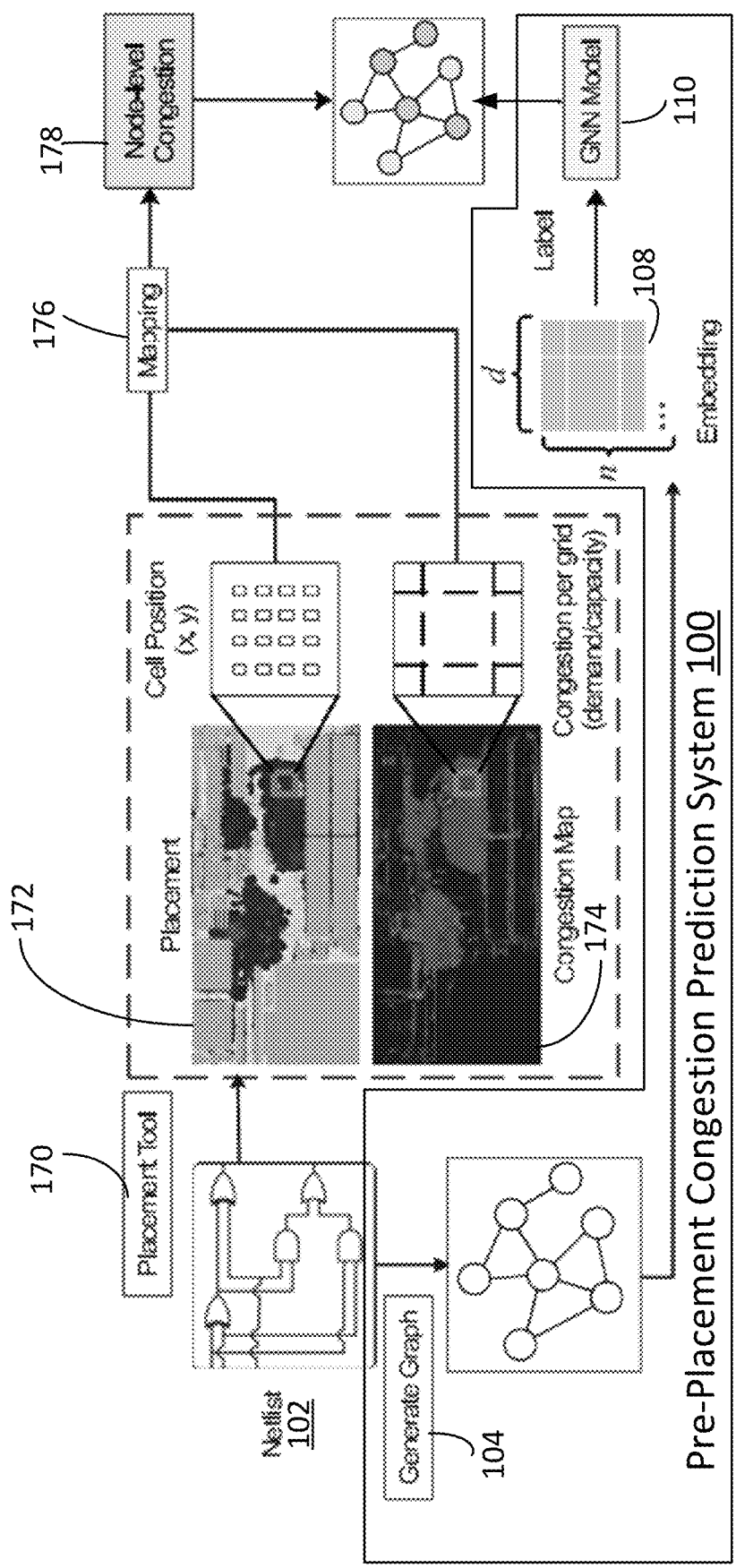
FIG. 8 is an illustration showing training of the neural network module of the system for congestion prediction.

Referring again to FIG. 1, pre-deployment configuration of the congestion prediction system 100 will now be described. The GNN 160 and the MLP 162 of NN module 110 are each configured by respective sets of parameters (e.g., weights W and biases b) that are learned prior to deployment of congestion prediction system 100. In example embodiments, this is done through supervised training, as illustrated in FIG. 8.

In example embodiments, a training dataset is created based on a set of chip designs, each of which corresponds to as respective instance of netlist data 102. For each instance of netlist data 102 (i.e., for each chip design), an EDA placement tool 170 (e.g., DREAMPLACE™, RePlAce™, etc.) is used to generate a placement map 172 that includes (x,y) placement cell positions for all standard cells 124 in the netlist data 102. As the circuit elements 118 are being placed on a notional chip 120, a congestion map 174 is generated that provides grid-based congestion values that correspond to grid-cell locations on the chip. By way of example, a congestion value may be the ratio of the demand for routing tracks within a grid-cell relative to a defined threshold capacity. For example, a placement demand of 12 routing tracks for wires for a grid cell that has a threshold capacity of 10 can result in a congestion value of 1.2; a placement demand of 5 routing tracks for a grid cell that has a threshold capacity of 10 can result in a congestion value of 0.5. In some examples, each grid-cell may have dimensions that are set to be slightly larger than the dimensions of a typical standard cell.

A chip grid-cell to standard cell mapping is then applied by a mapping operation 176 to provide each standard cell 124 in the netlist data 102 with a ground-truth congestion label y. For example, the ground-truth congestion label y can be equal to an overflow value in the grid-cell that the standard cell 125 is primarily located within. The ground-truth congestion labels y can be normalized to lie in a fixed range.

Each instance of netlist data 102 and associated ground-truth congestion labels Y provides a training dataset instance that corresponds to a single graph G. The labelled dataset can then be used to train the congestion prediction system 100, and in particular the GNN 160 and the MLP 162 of NN module 110 using known training methods. For example, in the case where the congestion labels Y are continuous, the GNN 160 (and MLP 162 if present) can be trained to minimize a square loss between the ground truth labels Y and the predicted labels $\hat{Y}$.

In one example, the netlist data 102 for each training set instance is converted to a graph by graph conversion module 104 and partitioned by graph partition module 106. Each node is provided with a network embedding and enhanced features by topology feature extraction module 108. Following this, the GNN 160 is used to predict the node labels. Each iteration does a full pass over the graph and each partition is fed in turn by turn each iteration. Optimization can be achieved using a known optimizer such as ADAM. The post-predictor MLP 162 may be optionally used. Skip/residual connections may be used in the NN module 110 if required.

In at least some examples, the disclosed congestion prediction system 100 can offer one or more advantages as follows. The disclosed application of sub-graph partitioning and topology feature extraction can, when compared to other EDA systems, enable 1) efficient training on large and large-scale designs; and 2) achieve competitive performance without informative node features by generating structural features based on the Netlist; and 3) training of a greater variety of graphs and achieve comparable representation across graphs.

Known matrix-factorization based embedding approaches have a beneficial property of learning aligned embedding across graphs, however are not scalable in terms of training. This shortcoming is solved in the present disclosure by operating on the sub-graph level, allowing matrix-factorization to be applied in the context of a netlist. A graph partition technique such as METIS can enable a min-cut partition to guarantee minimum edges between each sub-graph. A spectral embedding is then learned on each sub-graph level. This can enable training efficiency and embedding alignment across graphs naturally.

Alternatively, the disclosed explicit alignment procedure can allow random walk based embeddings to be applied in the context of EDA Netlist graph representation.

The disclosed system can be applied to further automate chip design.

Figure 10:
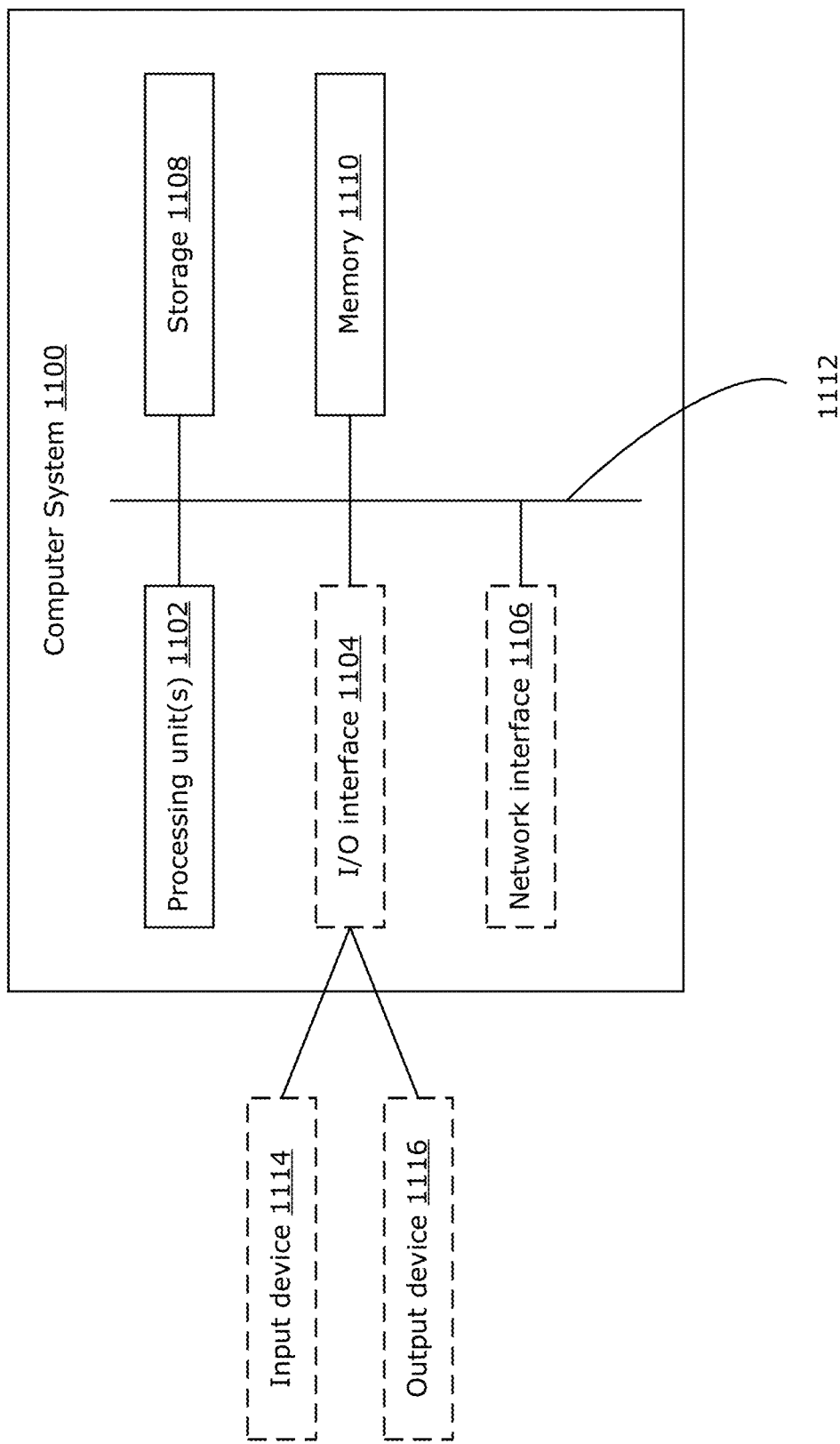
FIG. 10 is a block diagram of an example processing system that may be used to implement examples described herein.

FIG. 10 is a block diagram of an example computer system 1100, which may be part of a system or device that implements the congestion prediction system 100, including the one or more of the modules, functions, operations, modes, systems and/or devices described of the example the congestion prediction system 100. Other computer systems suitable for implementing embodiments described in the present disclosure may be used, which may include components different from those discussed below. Although FIG. 10 shows a single instance of each component, there may be multiple instances of each component in the computer system 1100.

The computer system 1100 may include one or more processing units 1102, such as a processor, a microprocessor, an application-specific integrated circuit (ASIC), a field-programmable gate array (FPGA), or combinations thereof. The one or more processing units 1102 may also include other processing units (e.g. a Neural Processing Unit (NPU), a tensor processing unit (TPU), and/or a graphics processing unit (GPU)).

Optional elements in FIG. 10 are shown in dashed lines. The computer system 1100 may also include one or more optional input/output (I/O) interfaces 1104, which may enable interfacing with one or more optional input devices 1114 and/or optional output devices 1116. In the example shown, the input device(s) 1114 (e.g., a keyboard, a mouse, a microphone, a touchscreen, and/or a keypad) and output device(s) 1116 (e.g., a display, a speaker and/or a printer) are shown as optional and external to the computer system 1100. In other examples, one or more of the input device(s) 1114 and/or the output device(s) 1116 may be included as a component of the computer system 1100. In other examples, there may not be any input device(s) 1114 and output device(s) 1116, in which case the I/O interface(s) 1104 may not be needed.

The computer system 1100 may include one or more optional network interfaces 1106 for wired (e.g. Ethernet cable) or wireless communication (e.g. one or more antennas) with a network (e.g., an intranet, the Internet, a P2P network, a WAN and/or a LAN).

The computer system 1100 may optionally include one or more storage units 1108, which may include a mass storage unit such as a solid-state drive, a hard disk drive, a magnetic disk drive and/or an optical disk drive. The computer system 1100 may include one or more memories 1110, which may include both volatile and non-transitory memories (e.g., a flash memory, a random access memory (RAM), and/or a read-only memory (ROM)). The non-transitory memory(ies) 1110 may store instructions of the congestion prediction system 100 for execution by the processing unit(s) 1102 to implement the features and modules and ML models disclosed herein. The memory(ies) 110 may store other software instructions, such as instructions for implementing an operating system, and other applications/functions. The memory(ies) 110 may store instructions of the various modules of the congestion prediction system 100, including the graph conversion module 104, the graph partition module 106, the topology feature extraction module 108 and the NN module 110 for execution by the processing unit(s) 1102.

Examples of non-transitory computer-readable media include a RAM, a ROM, an erasable programmable ROM (EPROM), an electrically erasable programmable ROM (EEPROM), a flash memory, a CD-ROM, or other portable memory storage.

There may be a bus 1112 providing communication among components of the computer system 1100, including the processing unit(s) 1102, optional I/O interface(s) 1104, optional network interface(s) 1106, storage unit(s) 1108 and/or memory(ies) 1110. The bus 1112 may be any suitable bus architecture, including, for example, a memory bus, a peripheral bus or a video bus.

Figure 11:
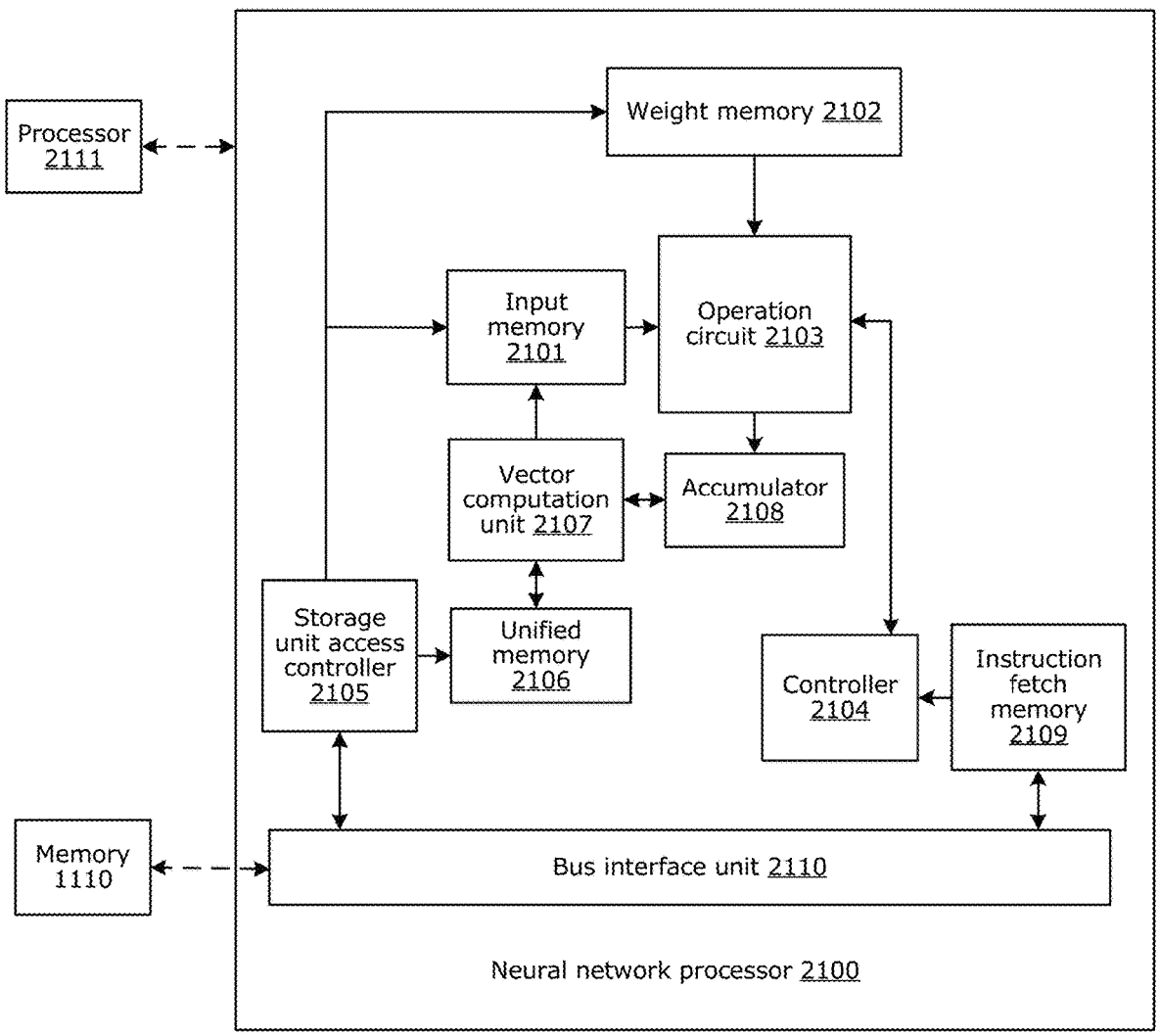
FIG. 11 is a block diagram illustrating an example hardware structure of a NN processor, in accordance with an example embodiment.

FIG. 11 is a block diagram illustrating an example hardware structure of an example NN processor 2100 of the processing unit 102 which may perform NN computations of NN module 110, including the NN computations of the GNN 160 and/or MLP 162, according to some example embodiments of the present disclosure. The NN processor 2100 may be provided on an integrated circuit (also referred to as a computer chip). All the NN computations of the layers of the GNN 160 and/or the MLP 162 may be performed using the NN processor 2100.

The processing units (s) 1102 (FIG. 10) may include a further processor 2111 in combination with NN processor 2100. The NN processor 2100 may be any processor that is applicable to NN computations, for example, a Neural Processing Unit (NPU), a tensor processing unit (TPU), a graphics processing unit (GPU), or the like. The NPU is used as an example. The NPU may be mounted, as a coprocessor, to the processor 2111, and the processor 2111 allocates a task to the NPU. A core part of the NPU is an operation circuit 2103. A controller 2104 controls the operation circuit 2103 to extract matrix data from memories (2101 and 2102) and perform multiplication and addition operations.

In some implementations, the operation circuit 2103 internally includes a plurality of processing units (Process Engine, PE). In some implementations, the operation circuit 2103 is a bi-dimensional systolic array. Besides, the operation circuit 2103 may be a uni-dimensional systolic array or another electronic circuit that can implement a mathematical operation such as multiplication and addition. In some implementations, the operation circuit 2103 is a general matrix processor.

For example, it is assumed that there are an input matrix A, a weight matrix B, and an output matrix C. The operation circuit 2103 obtains, from a weight memory 2102, weight data of the matrix B and caches the data in each PE in the operation circuit 2103. The operation circuit 2103 obtains input data of the matrix A from an input memory 2101 and performs a matrix operation based on the input data of the matrix A and the weight data of the matrix B. An obtained partial or final matrix result is stored in an accumulator (accumulator) 2108.

A unified memory 2106 is configured to store input data and output data. Weight data is directly moved to the weight memory 2102 by using a storage unit access controller 2105 (Direct Memory Access Controller, DMAC). The input data is also moved to the unified memory 2106 by using the DMAC.

A bus interface unit (BIU, Bus Interface Unit) 2110 is used for interaction between the DMAC and an instruction fetch memory 2109 (Instruction Fetch Buffer). The bus interface unit 2110 is further configured to enable the instruction fetch memory 2109 to obtain an instruction from the memory 1110, and is further configured to enable the storage unit access controller 2105 to obtain, from the memory 1110, source data of the input matrix A or the weight matrix B.

The DMAC is mainly configured to move input data from memory 1110 Double Data Rate (DDR) to the unified memory 2106, or move the weight data to the weight memory 2102, or move the input data to the input memory 2101.

A vector computation unit 2107 includes a plurality of operation processing units. If needed, the vector computation unit 2107 performs further processing, for example, vector multiplication, vector addition, an exponent operation, a logarithm operation, or magnitude comparison, on an output from the operation circuit 2103. The vector computation unit 2107 is mainly used for computation at a neuron or a layer (described below) of a neural network.

In some implementations, the vector computation unit 2107 stores a processed vector to the unified memory 2106. The instruction fetch memory 2109 (Instruction Fetch Buffer) connected to the controller 2104 is configured to store an instruction used by the controller 2104.

The unified memory 2106, the input memory 2101, the weight memory 2102, and the instruction fetch memory 2109 are all on-chip memories. The memory 1110 is independent of the hardware architecture of the NPU 2100.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices, and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, functional units in the example embodiments may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of this disclosure essentially, or the part contributing to the prior art, or some of the technical solutions may be implemented in a form of a software product. The software product is stored in a storage medium and includes several instructions for instructing a computer device (which may be a personal computer, a server, or a network device) to perform all or some of the steps of the methods described in the embodiments of this application. The foregoing storage medium includes any medium that can store program code, such as a universal serial bus (USB) flash drive, a removable hard disk, a read-only memory (ROM), a random access memory (RAM), a magnetic disk, or an optical disc, among others.

The foregoing descriptions are merely specific implementations but are not intended to limit the scope of protection. Any variation or replacement readily figured out by a person skilled in the art within the technical scope shall fall within the scope of protection. Therefore, the scope of protection shall be subject to the protection scope of the claims.

The invention claimed is:

1. A computer implemented method for assisting electronic chip design, comprising:
receiving netlist data for a proposed electronic chip design, the netlist data including a list of circuit elements and a list of interconnections between the circuit elements;
converting the netlist data to a graph that represents at least some of the circuit elements as nodes and represents the interconnections between the circuit elements as edges;
extracting network embeddings for the nodes based on a graph topology represented by the edges;
extracting degree features for the nodes based on the graph topology; and
computing, using a graph neural network, a respective congestion prediction for each of the circuit elements that are represented as nodes, based on the extracted network embeddings and the extracted degree features.

2. The method of claim 1 comprising partitioning the graph into a plurality of partitioned graphs that each comprise a respective subset of the nodes and edges, and wherein computing the respective congestion predictions is performed independently for each of the plurality of partitioned graphs.

3. The method of claim 1 comprising partitioning the graph into a plurality of partitioned graphs that each comprise a respective subset of the nodes and edges, wherein extracting the network embeddings for the nodes comprises performing a matrix factorization for each of the plurality of partitioned graphs.

4. The method of claim 3 wherein performing a matrix factorization for each of the plurality of partitioned graphs comprises non-linear spectral network embedding using a Laplacian matrix.

5. The method of claim 1 wherein extracting network embeddings for the nodes comprises applying a random-walk based embedding.

6. The method of claim 1 wherein the congestion prediction for each circuit element is indicative of a demand for wire routing tracks at a location corresponding a placement location for the circuit element of the proposed electronic chip design.

7. The method of claim 1 wherein the circuit elements included in the netlist includes macros, standard cells and chip terminals, wherein macros are larger than standard cells, and converting the netlist data to the graph comprises representing only the standard cells as nodes.

8. The method of claim 7 wherein converting the netlist data to the graph comprises generating a node feature vector that includes a set of attributes for each node, wherein the set of attributes includes dimensions of the standard cell represented by the node.

9. The method of claim 8 comprising concatenating the set of attributes, the degree features and the networks embeddings for each node to generate an enhanced node feature vector, wherein the graph neural network is configured to generate the respective congestion predictions based on the enhanced node feature vectors.

10. The method of claim 1 comprising generating a set of training data by performing circuit element placement based on a plurality of instances of netlist data, and determining, for each instance of netlist data respective ground truth congestion labels for circuit elements included in the netlist data; and performing supervised training of the graph neural network using the set of training data.

11. A computer system comprising one or more processing units and one or more non-transitory memories storing instructions for execution by the one or more processing devices, wherein execution of the instructions causes the computer system to:

convert netlist data to a graph that represents circuit elements identified in the netlist data as nodes and represents the interconnections between the circuit elements identified in the netlist data as edges;

extract network embeddings for the nodes based on a graph topology represented by the edges;

extract degree features for the nodes based on the graph topology; and compute, using a graph neural network, a respective congestion prediction for each of the circuit elements that are represented as nodes, based on the extracted network embeddings and the extracted degree features.

12. The system of claim 11, wherein execution of the instructions further causes the computer system to partition the graph into a plurality of partitioned graphs that each comprise a respective subset of the nodes and edges, and wherein computing the respective congestion predictions is performed independently for each of the plurality of partitioned graphs.

13. The system of claim 11, wherein execution of the instructions further causes the computer system to partition the graph into a plurality of partitioned graphs that each comprise a respective subset of the nodes and edges, wherein extracting the network embeddings for the nodes comprises performing a matrix factorization for each of the plurality of partitioned graphs.

14. The system of claim 13, wherein performing a matrix factorization for each of the plurality of partitioned graphs comprises non-linear spectral network embedding using a Laplacian matrix.

15. The system of claim 11, wherein extracting network embeddings for the nodes comprises applying a random-walk based embedding.

16. The system of claim 11, wherein the congestion prediction for each circuit element is indicative of a demand for wire routing tracks at a location corresponding a placement location for the circuit element of the proposed electronic chip design.

17. The system of claim 11, wherein the circuit elements included in the netlist includes macros, standard cells and chip terminals, wherein macros are larger than standard cells, and converting the netlist data to the graph comprises representing only the standard cells as nodes.

18. The system of claim 11, wherein execution of the instructions causes the computer system to convert the netlist data to the graph by generating a node feature vector that includes a set of attributes for each node, wherein the set of attributes includes dimensions of the standard cell represented by the node.

19. The system of claim 11, wherein execution of the instructions further causes the computer system to concatenate the set of attributes, the degree features and the networks embeddings for each node to generate an enhanced node feature vector, wherein the graph neural network is configured to generate the respective congestion predictions based on the enhanced node feature vectors.

20. A non-transitory computer readable medium storing instructions, wherein execution of the instructions by one or more processors of a computer system causes the computer system to:

receive netlist data for a proposed electronic chip design, the netlist data including a list of circuit elements and a list of interconnections between the circuit elements;

convert the netlist data to a graph that represents at least some of the circuit elements as nodes and represents the interconnections between the circuit elements as edges;

extract network embeddings for the nodes based on a graph topology represented by the edges;

extract degree features for the nodes based on the graph topology; and compute using a graph neural network, a respective congestion prediction for each of the circuit elements that are represented as nodes, based on the extracted network embeddings and the extracted degree features.

* * * * *